(12) United States Patent
Dong

(10) Patent No.: US 12,172,841 B2
(45) Date of Patent: Dec. 24, 2024

(54) ARTICLE TRANSPORT VEHICLE

(71) Applicant: Daifuku Co., Ltd., Osaka (JP)

(72) Inventor: Zheguang Dong, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 85 days.

(21) Appl. No.: 18/201,337

(22) Filed: May 24, 2023

(65) Prior Publication Data

US 2023/0382647 A1 Nov. 30, 2023

(51) Int. Cl.
*B65G 17/00* (2006.01)
*B60L 5/00* (2006.01)
*B61B 3/02* (2006.01)
*B61F 19/06* (2006.01)
*B65G 35/06* (2006.01)
*H01L 21/677* (2006.01)

(52) U.S. Cl.
CPC .............. *B65G 17/005* (2013.01); *B61B 3/02* (2013.01); *B61F 19/06* (2013.01); *B65G 35/06* (2013.01); *H01L 21/677* (2013.01); *B60L 5/00* (2013.01); *B65G 17/00* (2013.01)

(58) Field of Classification Search
CPC .... B60L 5/00; H01L 21/677; H01L 21/67706; H01L 21/67017; B61F 19/06; B61B 3/02; B61B 13/04; B65G 17/005; B65G 36/06; B65G 17/00
USPC ...................................... 198/465.1
See application file for complete search history.

(56) References Cited

U.S. PATENT DOCUMENTS

| | | | |
|---|---|---|---|
| 2015/0284011 A1* | 10/2015 | Wada | B61C 13/04 |
| | | | 105/155 |
| 2016/0207548 A1* | 7/2016 | Katahira | B61B 13/00 |
| 2018/0099680 A1* | 4/2018 | Murakami | B60L 5/00 |
| 2023/0192412 A1* | 6/2023 | Otsuka | H01L 21/6735 |
| | | | 198/465.1 |
| 2023/0402296 A1* | 12/2023 | Kim | H01L 21/67393 |

FOREIGN PATENT DOCUMENTS

| | | | | |
|---|---|---|---|---|
| CN | 106573734 A | * | 4/2017 | ............. B61B 13/12 |
| JP | 2018115066 A | | 7/2018 | |
| JP | 2023154808 A | * | 10/2023 | ............. B61B 13/00 |
| KR | 20180040490 A | * | 4/2018 | ............... B60L 5/00 |

* cited by examiner

*Primary Examiner* — James R Bidwell
(74) *Attorney, Agent, or Firm* — The Webb Law Firm

(57) ABSTRACT

An article transport vehicle configured to travel along a first rail and a second rail parallel to each other and transport an article, includes: a first wheel configured to roll on a first travel surface, which is a travel surface of the first rail; and a second wheel configured to roll on a second travel surface, which is a travel surface of the second rail. The first wheel has a first-wheel body that includes a first outer circumferential face and is made of synthetic resin. The second wheel has a second-wheel body that includes a second outer circumferential face and is made of synthetic resin. The first outer circumferential face has a plurality of first recessed grooves extending in a circumferential direction of the first wheel. The second outer circumferential face has a plurality of second recessed grooves extending in a circumferential direction of the second wheel.

8 Claims, 9 Drawing Sheets

ARTICLE TRANSPORT VEHICLE

CROSS-REFERENCE TO RELATED APPLICATION

This application claims priority to Japanese Patent Application No. 2022-085584 filed May 25, 2022, the disclosure of which is hereby incorporated by reference in its entirety.

BACKGROUND OF THE INVENTION

Field of the Invention

The present invention relates to an article transport vehicle that travels along rails.

Description of the Related Art

JP 2018-115066A (Patent Document 1) discloses an example of this type of article transport vehicle.

The article transport vehicle of Patent Document 1 has an air blowing unit that removes dust on a rail such that dust isn't left for a long time after it is generated. However, dust on a rail may impair the cleanliness of articles and an article storage facility, and it is desirable that less dust is generated. Dust on a rail includes wheel wear debris generated due to contact between the rail and a wheel of the article transport vehicle.

SUMMARY OF THE INVENTION

It is desirable to realize an article transport vehicle with which wheel wear can be reduced.

After careful study, the inventors found that providing a circumferential recessed groove in an outer circumferential face of each wheel can reduce wheel wear. The present invention is based on these findings.

A characteristic configuration of an article transport vehicle in view of the above lies in an article transport vehicle configured to travel along a first rail and a second rail parallel to each other and transport an article, the article transport vehicle comprising: a vehicle body to which an article holder configured to hold the article is joined; at least one first wheel supported by the vehicle body rotatably about a first rotation axis along a width direction orthogonal to a direction in which the first rail and the second rail extend as viewed in an up-down direction, and configured to roll on a first travel surface, which is a travel surface of the first rail; and at least one second wheel supported by the vehicle body rotatably about a second rotation axis along the width direction, and configured to roll on a second travel surface, which is a travel surface of the second rail, wherein the at least one first wheel has a first outer circumferential face configured to come into contact with the first travel surface, the at least one second wheel has a second outer circumferential face configured to come into contact with the second travel surface, the at least one first wheel has a first-wheel body that includes the first outer circumferential face and is made of a synthetic resin, the at least one second wheel has a second-wheel body that includes the second outer circumferential face and is made of a synthetic resin, the first outer circumferential face has a plurality of first recessed grooves extending in a circumferential direction of the at least one first wheel, the second outer circumferential face has a plurality of second recessed grooves extending in a circumferential direction of the at least one second wheel, the first-wheel body has a first side face facing a first side in the width direction, and a second side face facing a second side in the width direction, the first side in the width direction being a side in the width direction on which the at least one first wheel is disposed relative to the at least one second wheel, the second side in the width direction being a side opposite to the first side in the width direction, the second-wheel body has a third side face facing the first side in the width direction, and a fourth side face facing the second side in the width direction, the first side face is separated, in the width direction, from a first recessed groove disposed farthest on the first side in the width direction among the plurality of first recessed grooves, by a distance that is larger than a distance by which the second side face is separated, in the width direction, from a first recessed groove disposed farthest on the second side in the width direction among the plurality of first recessed grooves, and the fourth side face is separated, in the width direction, from a second recessed groove disposed farthest on the second side in the width direction among the plurality of second recessed grooves, by a distance that is larger than a distance by which the third side face is separated, in the width direction, from a second recessed groove disposed farthest on the first side in the width direction among the plurality of second recessed grooves.

According to this configuration, the outer circumferential face of each wheel has a plurality of recessed grooves extending in the circumferential direction. This makes it possible to reduce wheel wear while ensuring a wheel width necessary for supporting the weight of the article transport vehicle. A possible reason for the reduced wheel wear, although hypothetical, is that forming the recessed grooves on the circumferential face of each wheel reduces the true contact area of the outer circumferential face relative to the travel surface of the rail, thereby reducing the shearing force applied to the wheel in the sliding direction. Further, according to this configuration, a region without a recessed groove can be provided in an outer portion of the outer circumferential face in the width direction, where a contact load between the wheel and the travel surface of the rail tends to increase during travel along a curved path. This makes it easy to ensure the rigidity in the area where the contact load between the wheel and the travel surface of the rail is likely to increase during travel along a curved path. Accordingly, deformation of the outer circumferential face of each wheel during travel along a curved path can be kept small, thus further reducing wheel wear.

Further features and advantages of the article transport vehicle will become clear from the following description of the embodiments, which will be described with reference to the drawings.

DESCRIPTION OF THE INVENTION

Figure 1:
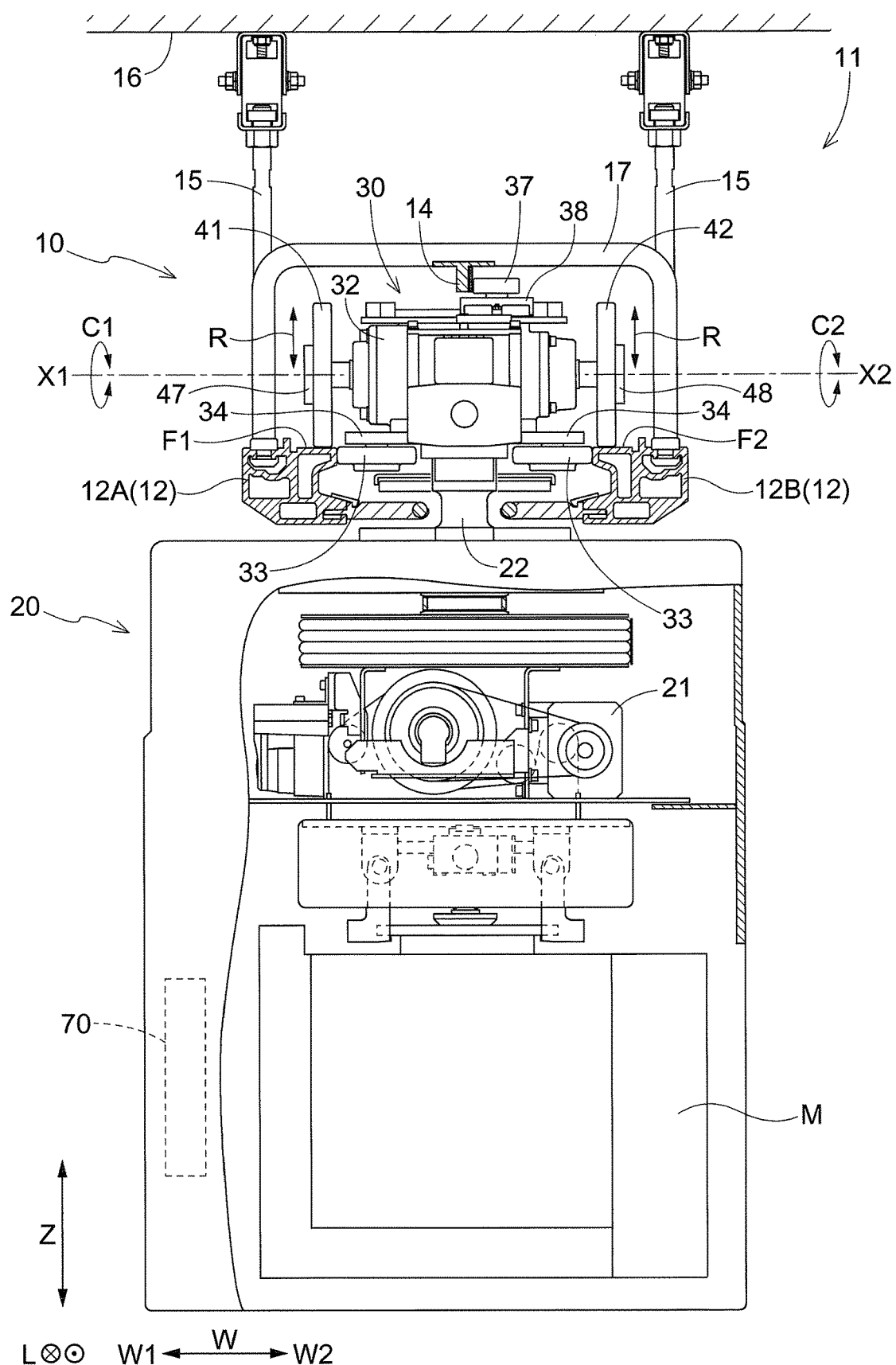
FIG. 1 is a rear view of an article transport vehicle.

Embodiments of an article transport vehicle 10 will be described below with reference to the drawings. FIG. 1 shows an article transport facility 11 that includes the article transport vehicle 10. The article transport facility 11 includes travel rails 12, which are a first rail 12A and a second rail 12B disposed parallel to each other. The article transport facility 11 also includes the article transport vehicle 10 that travels along the first rail 12A and the second rail 12B disposed parallel to each other and transports an article M. The article transport vehicle 10 of this embodiment transports a front opening unified pod (FOUP) for housing a semiconductor substrate as the article M. The article transport vehicle 10, a rear view of which is shown in FIG. 1, is an unmanned overhead transport vehicle. In the following description, a width direction W refers to a direction orthogonal to an extension direction L, i.e. the direction in which the first rail 12A and the second rail 12B extend as viewed in an up-down direction Z. In this embodiment, the up-down direction Z is parallel to the vertical direction.

The first rail 12A and the second rail 12B of this embodiment are suspended from and supported by a ceiling 16 via suspension members 15. The first rail 12A and the second rail 12B are disposed parallel to each other with a fixed distance therebetween in the width direction W via support members 17 having an inverted U-shape in a cross section taken along the width direction W. A first travel surface F1 refers to a travel surface of the first rail 12A, and a second travel surface F2 refers to a travel surface of the second rail 12B. The first travel surface F1 and the second travel surface F2 of this embodiment are flat surfaces. Note that the first rail 12A and the second rail 12B may be connected to each other, or the first rail 12A and the second rail 12B may be integrated. The first rail 12A and the second rail 12B may alternatively be separate rails.

The article transport vehicle 10 includes an article holder 20 for holding the article M, and a vehicle body 30 to which the article holder 20 is joined. The article holder 20 of this embodiment is located below the first rail 12A and the second rail 12B, and is suspended from and supported by the vehicle body 30. The article holder includes a lift device 21 capable of raising and lowering the article M below the first rail 12A and the second rail 12B.

The article transport vehicle 10 includes first wheels 41 and second wheels 42. Each first wheel 41 is rotatably supported by the vehicle body 30 about a first rotation axis X1 in the width direction W, and rolls on the first travel surface F1, which is the travel surface of the first rail 12A. Each second wheel 42 is rotatably supported by the vehicle body 30 about a second rotation axis X2 in the width direction W, and rolls on the second travel surface F2, which is the travel surface of the second rail 12B. Here, a radial direction R refers to a direction orthogonal to the first rotation axis center X1 and a direction orthogonal to the second rotation axis center X2. A first side W1 in the width direction W refers to the side in the width direction W on which the first wheels 41 are located relative to the second wheels 42, and the second side W2 in the width direction W refers to the opposite side. Note that the first rotation axis X1 and the second rotation axis center X2 of this embodiment are coaxial, but need not be coaxial.

The vehicle body 30 of this embodiment has traveling sections 32 that rotate the first wheels 41 and the second wheels 42. Each traveling section 32 includes a pair of left and right guide wheels 33 that freely rotate about respective axes in the up-down direction Z. The axis of each guide wheel 33 is supported by a guide wheel support plate 34. The pair of left and right guide wheels 33 is provided on the traveling section 32 in such a manner as to come into contact with corresponding side faces, on the inner side in the width direction W, of the first rail 12A and the second rail 12B. The article transport vehicle 10 travels along a travel path with the traveling sections 32 maintaining their orientations along the travel path due to the guide wheels 33 being in contact with and being guided by the first rail 12A and the second rail 12B. The traveling sections 32 and the article holder 20 of this embodiment are joined by joint shafts 22 in such a manner as to be relatively rotatable about a vertical axis in the up-down direction Z.

Figure 2:
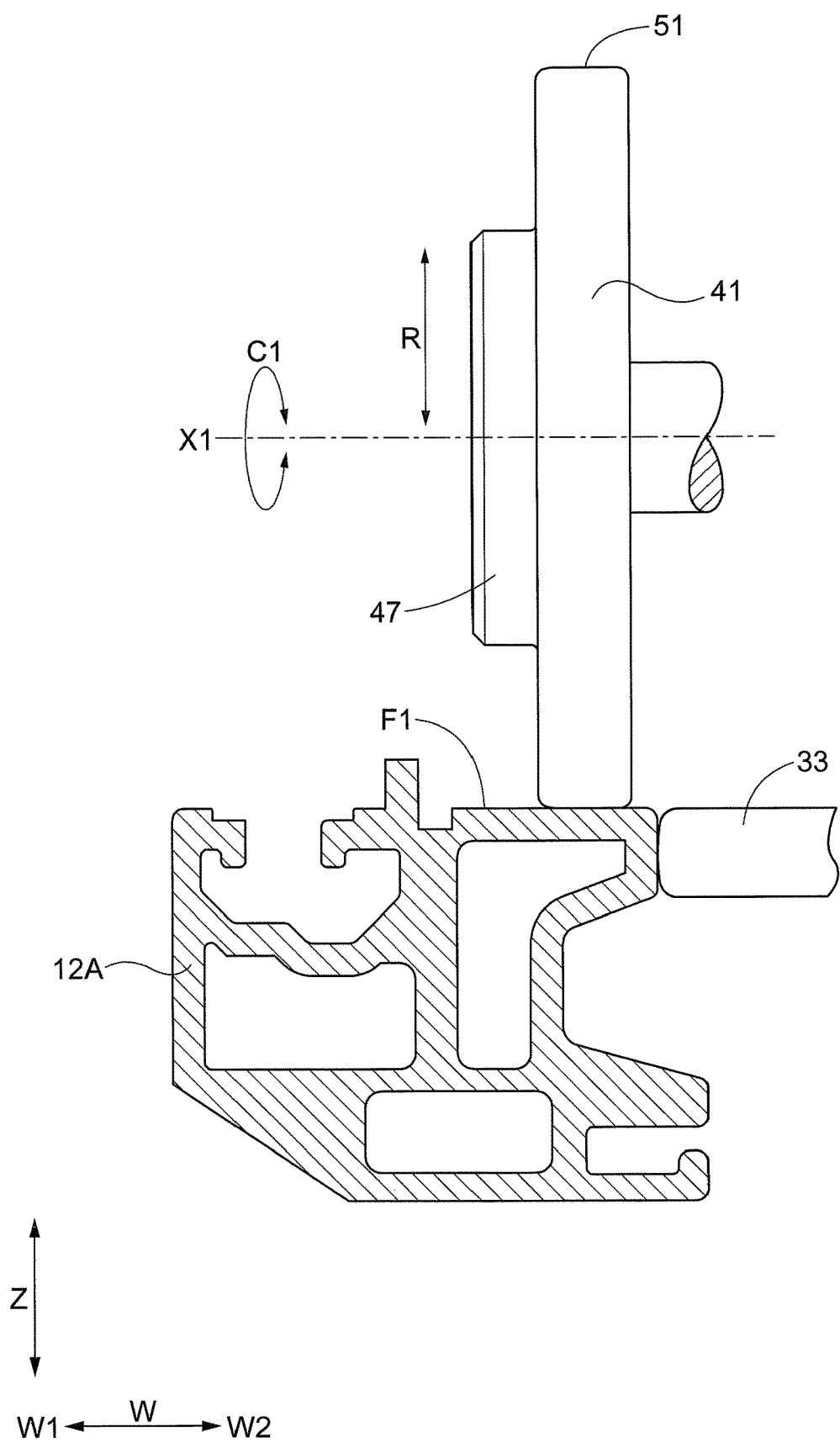
FIG. 2 is a rear view in which a first rail and a first wheel in FIG. 1 are enlarged.
Figure 3:
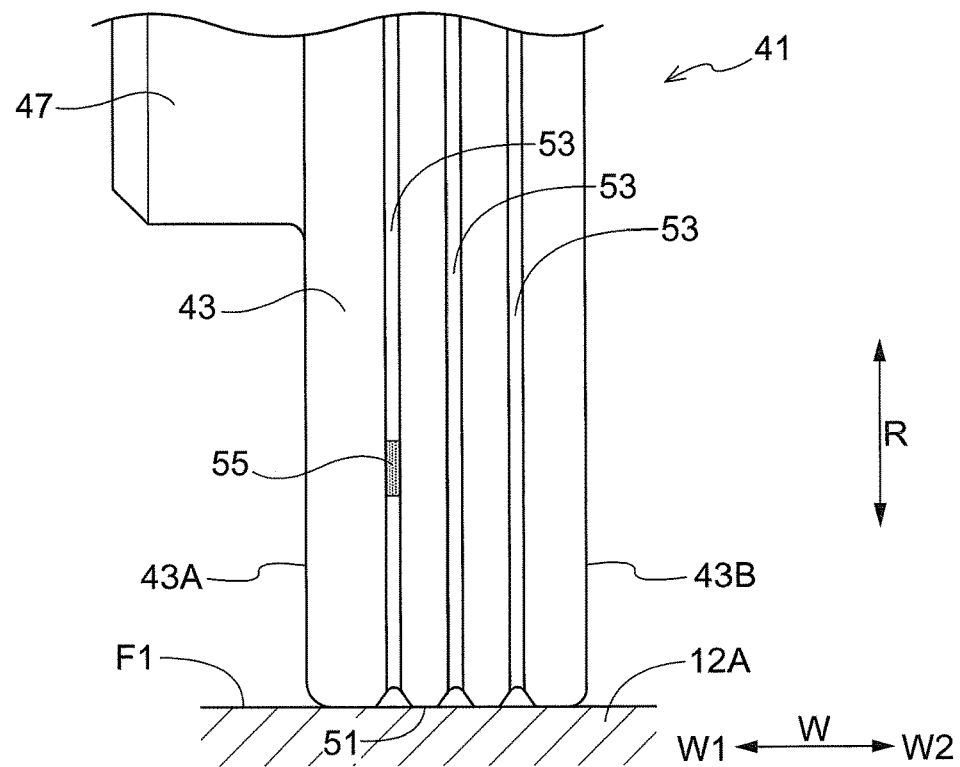
FIG. 3 is a rear view in which the first wheel in FIG. 1 is enlarged.
Figure 4:
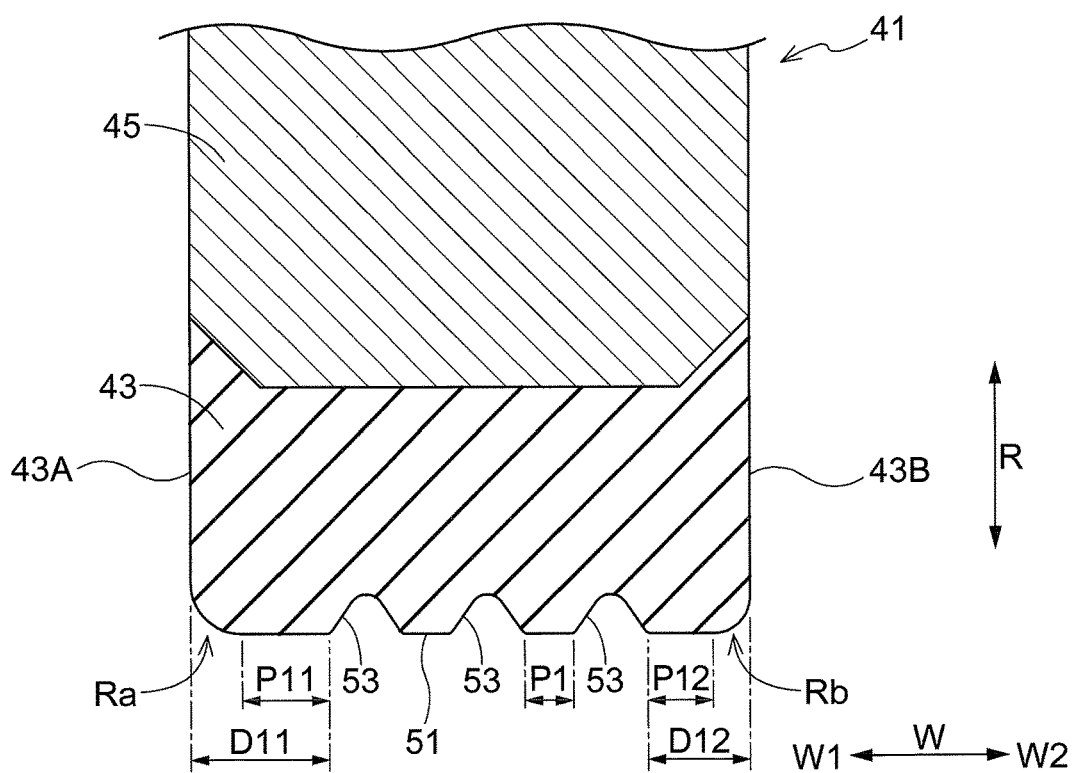
FIG. 4 is a cross-sectional view of the first wheel in FIG. 1 with three first recessed grooves.
Figure 5:
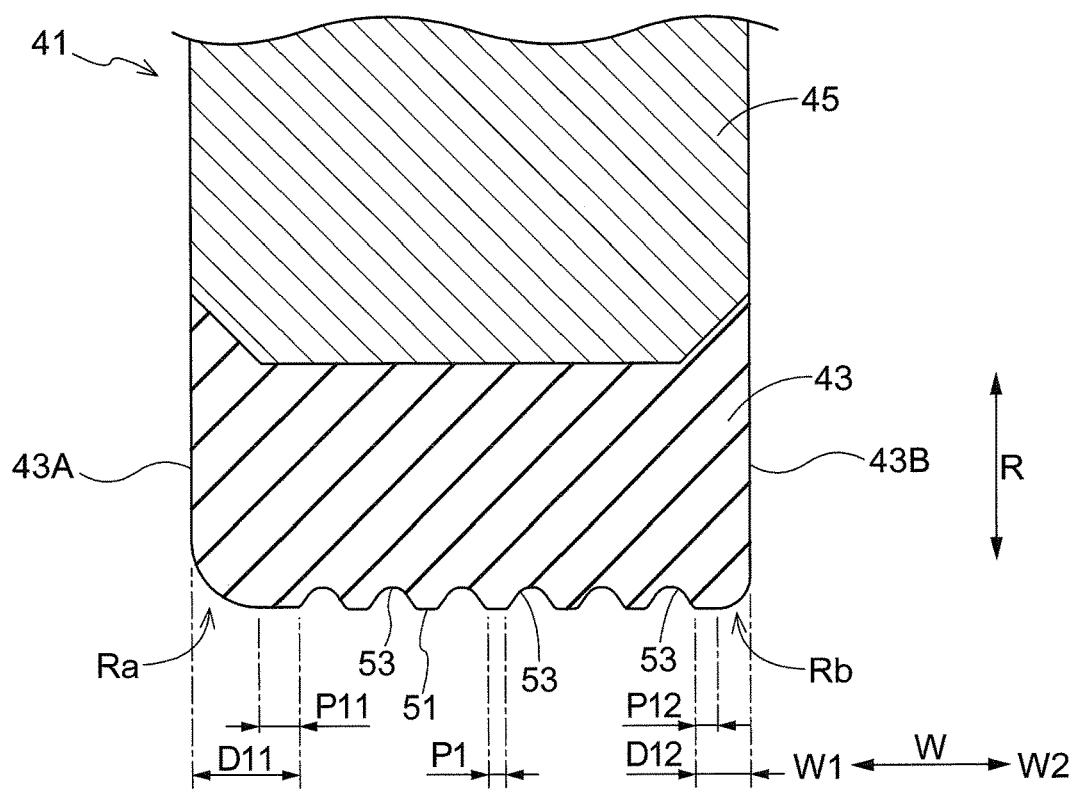
FIG. 5 is a cross-sectional view of the first wheel in FIG. 1 with six first recessed grooves.

FIG. 2 shows the first rail 12A and a first wheel 41 in an enlarged manner. FIG. 3 is a rear view in which the first wheel 41 is enlarged. FIG. 4 is a cross-sectional view of the first wheel 41 taken along a plane including the first rotation axis X1. A first outer circumferential face 51 refers to an outer circumferential face of the first wheel 41 that comes into contact with the first travel surface F1. The first outer circumferential face 51 has first recessed grooves 53, which extend in a circumferential direction C1 (see FIG. 2) of the first wheel 41. The first wheel 41 of this embodiment has a first-wheel body 43, which includes the first outer circumferential face 51 and is made of a synthetic resin. The synthetic resin that constitutes the first-wheel body 43 is desirably elastic, and examples thereof include urethane, a synthetic rubber, or the like. In this embodiment, a first-wheel rim section 45, which is made of metal, is provided on the inner side of the first-wheel body 43 in the radial direction R, and a first-wheel boss section 47, which is made of metal, is provided on the first side W1 of the first-wheel body 43 in the width direction. Preferably, a plurality of first recessed groove 53 are provided. More preferably, three or more first recessed grooves 53 are disposed next to each other in the width direction W. FIGS. 3 and 4 show an example of three first recessed grooves 53, and FIG. 5 shows an example of six first recessed grooves 53.

Figure 6:
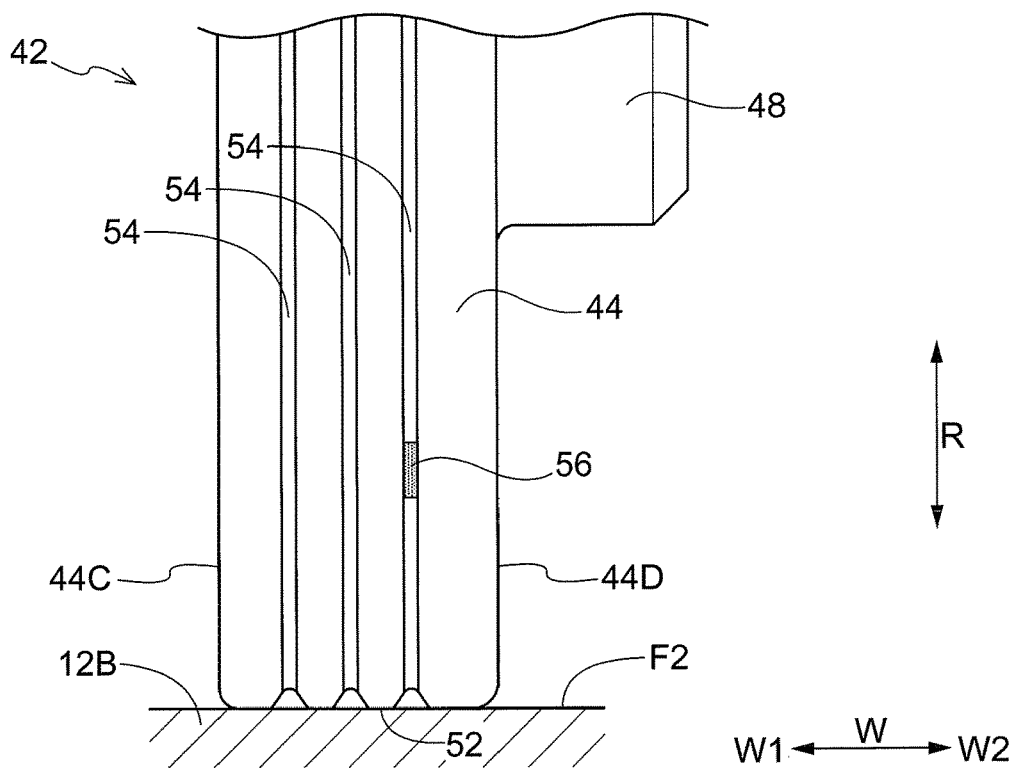
FIG. 6 is a rear view in which a second wheel in FIG. 1 is enlarged.
Figure 7:
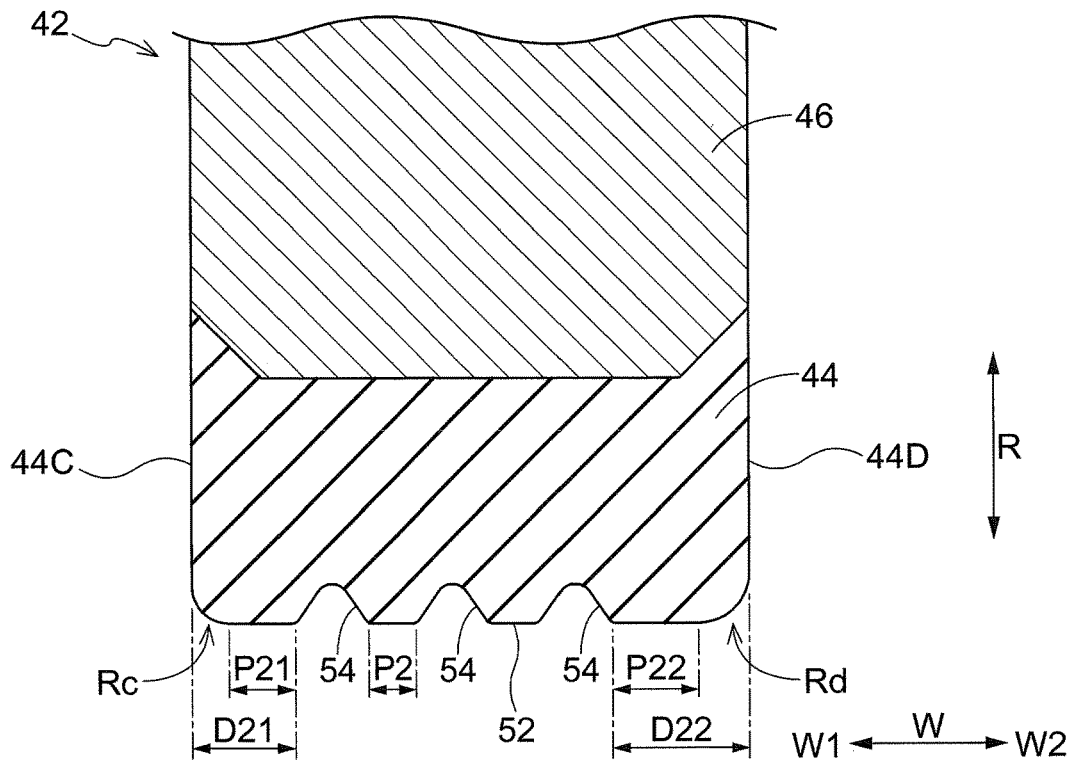
FIG. 7 is a cross-sectional view of the second wheel in FIG. 1 with three second recessed grooves.
Figure 8:
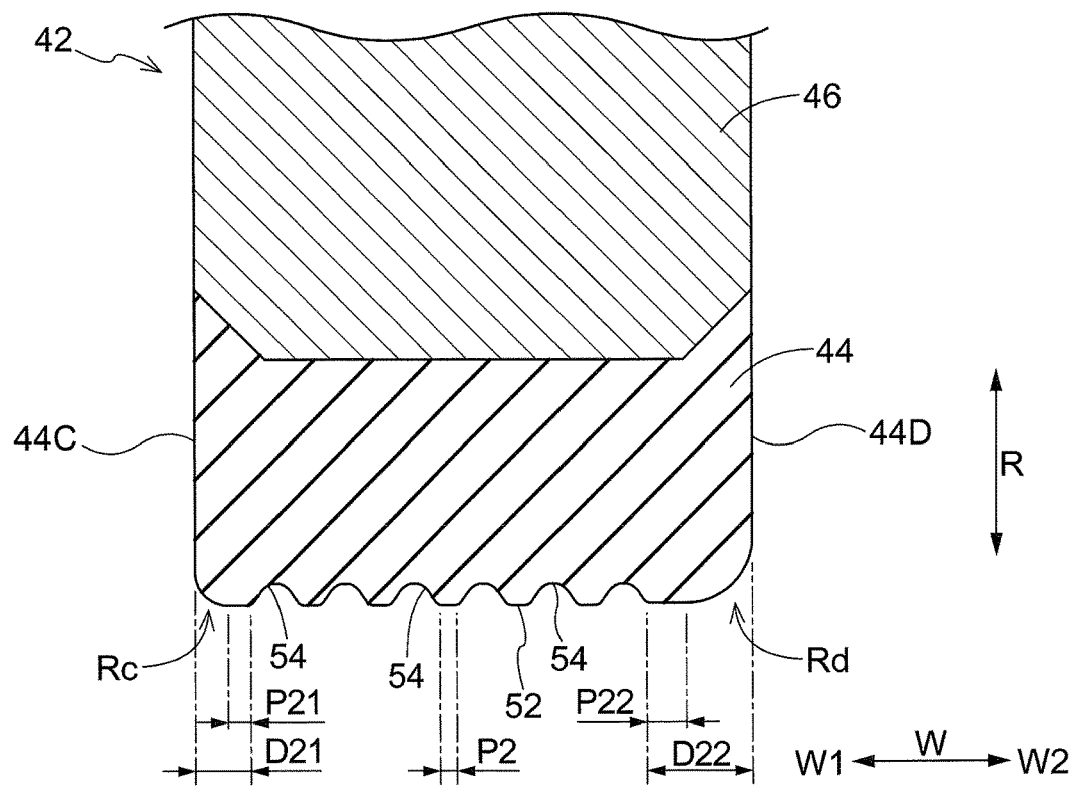
FIG. 8 is a cross-sectional view of the second wheel in FIG. 1 with six second recessed grooves.

FIG. 6 is a rear view in which a second wheel 42 is enlarged. FIG. 7 is a cross-sectional view of the second wheel 42 taken along a plane including the second rotation axis X2. A second outer circumferential face 52 refers to an outer circumferential face of the second wheel 42 that comes into contact with the second travel surface F2. The second outer circumferential face 52 has second recessed grooves 54, which extend in a circumferential direction C2 (see FIG. 1) of the second wheel 42. The second wheel 42 of this embodiment has a second-wheel body 44, which includes the second outer circumferential face 52 and is made of a synthetic resin. The synthetic resin that constitutes the second-wheel body 44 is desirably elastic, and examples thereof include urethane, a synthetic rubber, or the like. In this embodiment, a second-wheel rim section 46, which is made of metal, is provided on the inner side of the second-wheel body 44 in the radial direction R, and a second-wheel boss section 48, which is made of metal, is provided on the second side W2 of the second-wheel body 44 in the width direction. Preferably, a plurality of second recessed grooves 54 are provided. More preferably, three or more second recessed grooves 54 are disposed next to each other in the width direction W. FIGS. 6 and 7 show an example of three second recessed grooves 54, and FIG. 8 shows an example of six second recessed grooves 54.

Returning to FIGS. 4 and 5, a first side face 43A of the first-wheel body 43 refers to a side face facing the first side W1 in the width direction W, and a second side face 43B of the first-wheel body 43 refers to a side face facing the second side W2 in the width direction W. In this embodiment, a distance D11 in the width direction W between the first recessed groove 53 farthest on the first side W1 in the width direction W and the first side face 43A is larger than a distance D12 in the width direction W between the first recessed groove 53 farthest on the second side W2 in the width direction W and the second side face 43B. This makes it easy to ensure rigidity in a region of the first outer circumferential face 51 of the first-wheel body 43 on the first side W1 in the width direction W in the case where this region supports the centrifugal force acting on the article transport vehicle 10 during travel along a curved path, for example. That is, the rigidity in the/this region can be easily ensured when the contact load on a region of the first-wheel body 43 on the first side W1 in the width direction W is larger than that on a region on the second side W2 in the width direction W during travel along a curved path.

In the shown example, each first recessed groove 53 is a recessed groove that is linear in the circumferential direction C1, but may alternatively have a triangular wave shape, a curved wave shape, or the like. Also, in the shown example, each first recessed groove 53 is a recessed groove that is continuous in the circumferential direction C1 of the first wheel 41, but may alternatively be a recessed groove that is intermittent in the circumferential direction C1 of the first wheel 41. In this embodiment, a cross-section of a groove bottom of the first recessed groove 53 taken along the radial direction R (i.e. a cross section orthogonal to the circumferential direction C1; a cross section including the first rotation axis X1) has an arc shape.

Returning to FIGS. 7 and 8, a third side face 44C of the second-wheel body 44 refers to a side face facing the first side W1 in the width direction W, and a fourth side face 44D of the second-wheel body 44 refers to a side face facing the second side W2 in the width direction W. In this embodiment, a distance D22 in the width direction W between the second recessed groove 54 farthest on the second side W2 in the width direction W and the fourth side face 44D is larger than a distance D21 in the width direction W between the second recessed groove 54 farthest on the first side W1 in the width direction W and the third side face 44C. This makes it easy to ensure rigidity in a region of the second outer circumferential face 52 of the second-wheel body 44 on the second side W2 in the width direction W in the case where the region supports the centrifugal force acting on the article transport vehicle 10 during travel along a curved path, for example. That is, rigidity in the region can be easily ensured when the contact load on a region of the second-wheel body 44 on the second side W2 in the width direction W is larger than that on a region on the first side W1 in the width direction W during travel along a curved path.

In the shown example, each second recessed groove 54 is a recessed groove that is linear in the circumferential direction C2, but may alternatively have a triangular wave shape, a curved wave shape, or the like. Also, in the shown example, each second recessed groove 54 is a recessed groove that is continuous in the circumferential direction C2 of the second wheel 42, but may alternatively be a recessed groove that is intermittent in the circumferential direction C2 of the second wheel 42. In this embodiment, a cross section of a groove bottom of the second recessed groove 54 taken along the radial direction R (i.e. a cross section orthogonal to the circumferential direction C2; a cross section including the second rotation axis X2) has an arc shape.

Returning to FIGS. 4 and 5, a first width P1 refers to the smallest width among the dimensions, in the width direction W, of flat portions sandwiched by two first recessed grooves 53 adjacent in the width direction W of the first outer circumferential face 51. In this embodiment, a dimension P12, in the width direction W, of a flat portion of the first outer circumferential face 51 that is located further on the second side W2 in the width direction W than the first recessed groove 53 farthest on the second side W2 in the width direction W is larger than the first width P1 and less than double the first width P1. Also, in this embodiment, a dimension P11, in the width direction W, of a flat portion of the first outer circumferential face 51 that is located further on the first side W1 in the width direction W than the first recessed groove 53 farthest on the first side W1 in the width direction W is larger than or equal to double the first width P1.

Returning to FIGS. 7 and 8, a second width P2 refers to the smallest width among the dimensions, in the width direction W, of flat portions sandwiched by two second recessed grooves 54 adjacent in the width direction W of the second outer circumferential face 52. In this embodiment, a dimension P21, in the width direction W, of a flat portion of the second outer circumferential face 52 that is located further on the first side W1 in the width direction W than the second recessed groove 54 farthest on the first side W1 in the width direction W is larger than the second width P2 and less than double the second width P2. Also, in this embodiment, a dimension P22, in the width direction W, of a flat portion of the second outer circumferential face 52 that is located further on the second side W2 in the width direction W than the second recessed groove 54 farthest on the second side W2 in the width direction W is larger than or equal to double the second width P2.

The first outer circumferential face 51 of this embodiment has a cylindrical shape with its central axis (coaxial with the first rotation axis X1) parallel to the first travel surface F1. In this embodiment, a connection section between the first outer circumferential face 51 and the first side face 43A is curved inward in the radial direction R while extending toward the first side W1 in the width direction W. A connection section between the first outer circumferential face 51 and the second side face 43B is curved inward in the radial direction R while extending toward the second side W2 in the width direction W. In the example shown in FIGS. 4 and 5, a curvature radius Ra of the connection section between the first outer circumferential face 51 and the first side face 43A is larger than a curvature radius Rb of the connection section between the first outer circumferential face 51 and the second side face 43B. If one connection section has more than one portion with different curvature radii, for example, the average of the curvature radii of these portions (e.g. an average obtained the lengths of the portions as weights) can be regarded as the curvature radius of the connection section. Alternatively, the curvature radius of a portion with the largest curvature radius among these portions can be regarded as the curvature radius of the connection section.

In this embodiment, a first radius decrement refers to a decrement in the radius of the first wheel 41 that serves as a reference for the replacement timing of the first wheel 41, and one of the plurality of first recessed grooves 53 has a first marker groove 55, which is a groove of the same depth as the first radius decrement, as shown in FIG. 3. The depth of the first marker groove 55 is smaller than the depth of the portions of the first recessed grooves 53 where the first marker groove is not provided. The first marker groove 55 in the shown example is provided in a portion of one first recessed groove 53, but the first marker groove 55 may alternatively be provided over the entire circumference of one of the first recessed grooves 53.

The second outer circumferential face 52 of this embodiment has a cylindrical shape with its central axis (coaxial with the second rotation axis X2) parallel to the second travel surface F2. In this embodiment, a connection section between the second outer circumferential face 52 and the third side face 44C is curved inward in the radial direction R while extending toward the first side W1 in the width direction W. A connection section between the second outer circumferential face 52 and the fourth side face 44D is curved inward in the radial direction R while extending toward the second side W2 in the width direction W. In the example shown in FIGS. 7 and 8, a curvature radius Rd of the connection section between the second outer circumferential face 52 and the fourth side face 44D is larger than a curvature radius Rc of the connection section between the second outer circumferential face 52 and the third side face 44C.

In this embodiment, a second radius decrement refers to a decrement in the radius of the second wheel 42 that serves as a reference for the replacement timing of the second wheel 42, and one of the plurality of second recessed grooves 54 has a second marker groove 56, which is a groove of the same depth as the second radius decrement, as shown in FIG. 6. The depth of the second marker groove 56 is smaller than the depth of the portions of the second recessed grooves 54 where the second marker groove 56 is not provided. The second marker groove 56 in the shown example is provided in a portion of one second recessed groove 54, but the second marker groove 56 may alternatively be provided over the entire circumference of one of the second recessed grooves 54.

Figure 9:
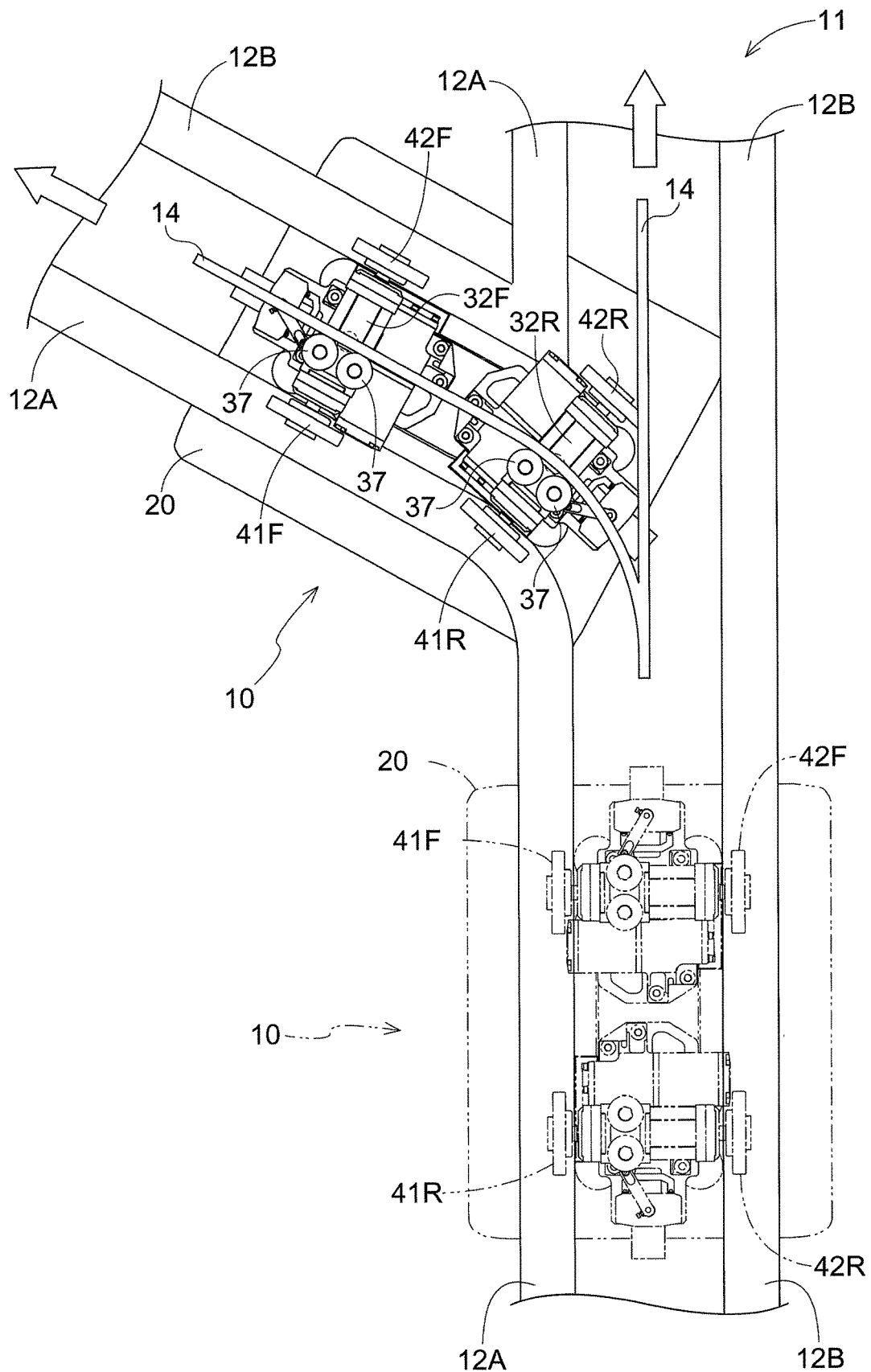
FIG. 9 shows the article transport vehicle in FIG. 1 traveling along a branch path.
Figure 10:
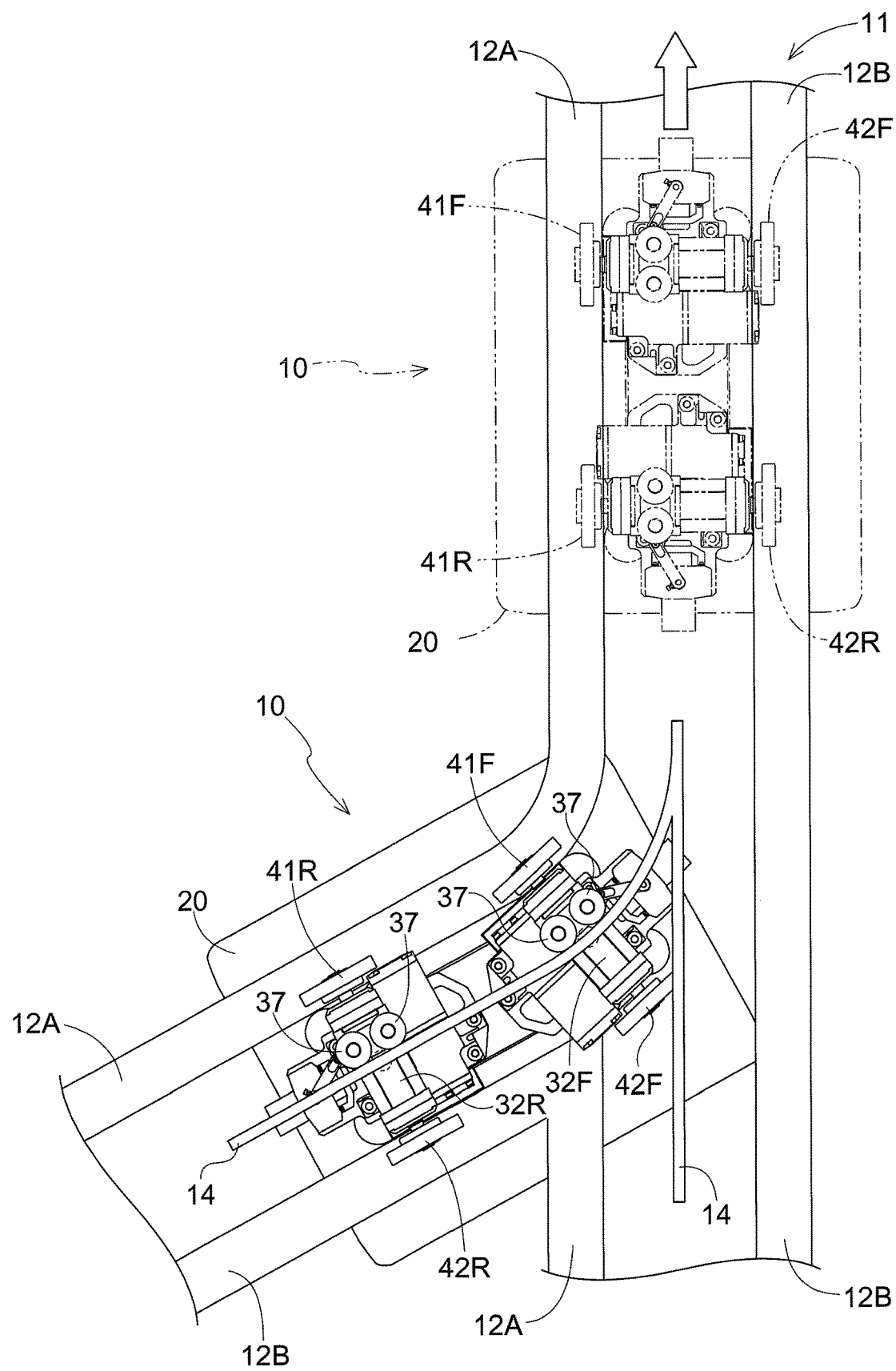
FIG. 10 shows the article transport vehicle in FIG. 1 traveling along a merging path.

FIG. 9 is a plan view of the article transport vehicle 10 traveling along a branch path in the article transport facility 11. FIG. 10 is a plan view of the article transport vehicle 10 traveling along a merging path in the article transport facility 11. The article transport facility 11 of this embodiment includes a travel path having a straight section and a curved section. This travel path includes a branch path and a merging path. Guide rails 14 for causing the article transport vehicle 10 to branch or merge are provided at the branch path and the merging path. The guide rails 14 of this embodiment are joined to and supported by the support members 17 at the branch path and the merging path, as shown in FIG. 1. Each guide rail 14 in the shown examples is installed above the first rail 12A and the second rail 12B, midway between the first rail 12A and the second rail 12B in a plan view.

Each traveling section 32 of this embodiment includes guide wheels 37 that rotates about a vertical axis (an axis in the up-down direction of the vehicle body 30) in an area above the first wheel 41 and the second wheel 42, as shown in FIG. 1. The guide wheels 37 come into contact with a side face of each guide rail 14. Each traveling section 32 also includes a guide driver 38 that moves the guide wheels 37 in the width direction W. The traveling section 32 moves the guide wheels 37 to a right guide position and a left guide position by moving the guide wheels 37 in the width direction W. The right guiding position is the position where the guide wheels 37 are located rightward of the center of the traveling section 32 in the width direction W as viewed from the traveling direction (i.e. toward the distal side of the paper plane in FIG. 1) and come into contact with the guide rail 14 from the right side, as shown in FIG. 1. The left guiding position is the position where the guide wheels 37 are located leftward of the center of the traveling section 32 in the width direction W and come into contact with the guide rail 14 from the left side.

The article transport vehicle 10 of this embodiment has two traveling sections 32, which are a first traveling section 32F and a second traveling section 32R located rearward of the first traveling section 32F relative to the vehicle body, as shown in FIGS. 9 and 10. The first traveling section 32F has a first front wheel 41F as one of the first wheels 41, and a second front wheel 42F as one of the second wheels 42. The second traveling section 32R has a first rear wheel 41R as the other one of the first wheels 41, and a second rear wheel 42R as the other one of the second wheels 42. The article transport vehicle 10 thus has the first front wheel 41F and the first rear wheel 41R as the first wheels 41, and the second front wheel 42F and the second rear wheel 42R as the second wheels 42.

Figure 11:
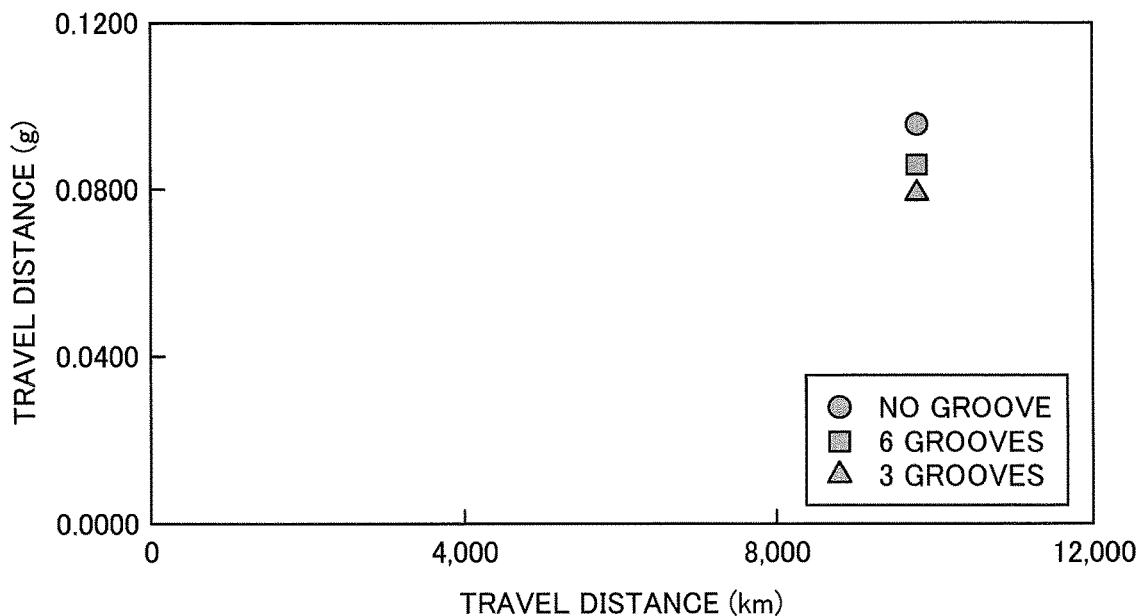
FIG. 11 shows the results of a wear evaluation test for the article transport vehicle in FIG. 1.

FIG. 11 shows the results of a wear evaluation test conducted by actually causing the article transport vehicle 10 to travel. The material of the first-wheel body 43 and the second-wheel body 44 used in this wear evaluation test was urethane. FIG. 11 representatively shows the wear evaluation test results for the first rear wheel 41R. The vertical axis indicates the decrement in weight (g) before and after travel involving the first rear wheel 41R as the amount of wear, and the horizontal axis indicates the distance (km) traveled by the article transport vehicle 10. The triangular mark in FIG. 11 indicates a test result obtained with a first wheel 41 having the three-groove configuration shown in FIG. 4 and a second wheel 42 having the three-groove configuration shown in FIG. 7. The circular mark indicates a test result obtained with the first wheel 41 and the second wheel 42 having no grooves. The results of the wear evaluation test shown in FIG. 11 indicate that the wheel wear is reduced when each wheel has three recessed grooves compared to when the wheels have no recessed groove.

Figure 13:
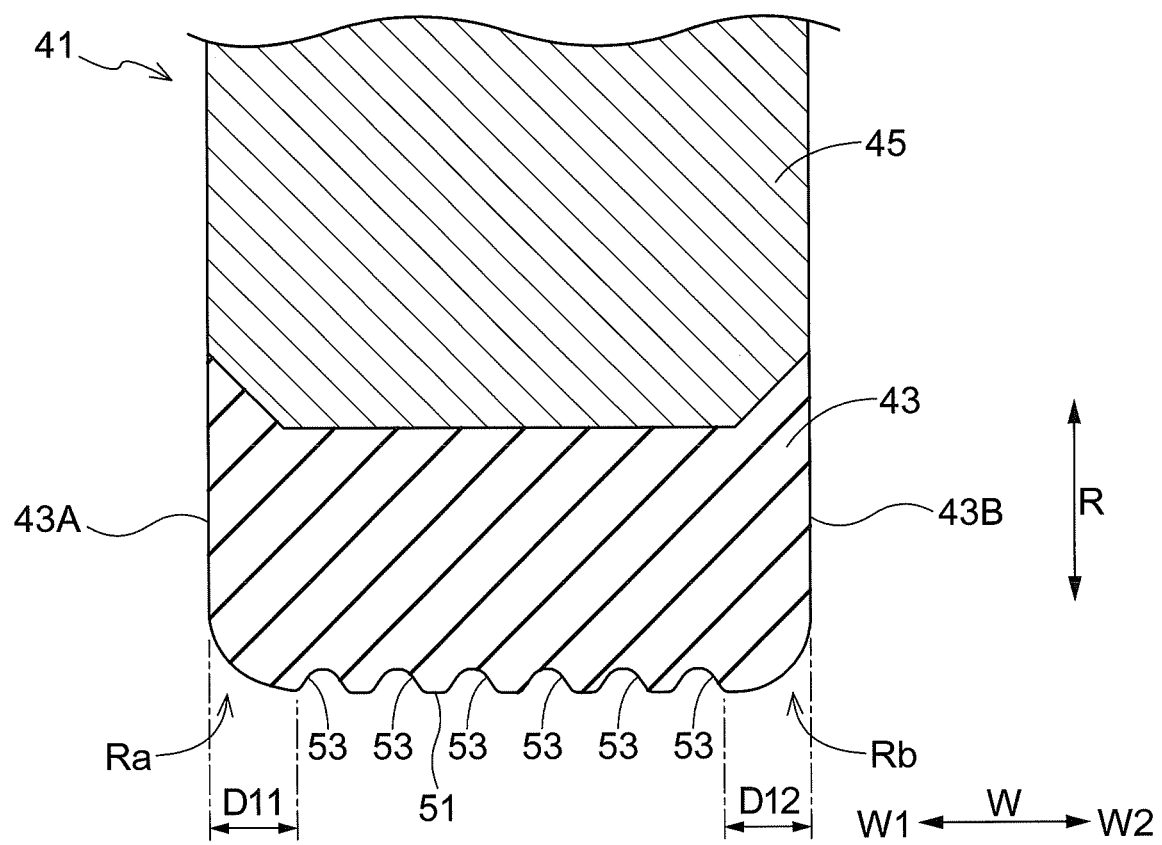
FIG. 13 is a cross-sectional view of the first wheel with different shaped first recessed grooves.

FIG. 13 shows a first wheel 41 having six recessed grooves extending in the circumferential direction C1, and corresponds to FIG. 4. The first wheel 41 shown in FIG. 13 is symmetrical with respect to the center in width direction W. That is, the distance D11 and the distance D12 have the same length, and the curvature radius Ra and the curvature radius Rb are the same curvature radius. The six recessed grooves have the same shape as each other. The square mark in FIG. 11 indicates a test result obtained with the first wheel 41 and the second wheel 42 that have the six-groove configuration shown in FIG. 13. The results of the wear evaluation test shown in FIG. 11 indicate that the wheel wear is reduced when each wheel has six recessed grooves compared to when the wheels have no recessed grooves. A possible reason for the reduced wheel wear, although hypothetical, is that forming the recessed grooves on the circumferential face of each wheel reduces the true contact area of the outer circumferential face of the wheel relative to the travel surface of the travel rail, thereby reducing the shearing force applied to the wheel in the sliding direction.

In this embodiment, when traveling in a branch section (see FIG. 9) of the travel path and a confluence section (see FIG. 10) of the travel path, the article transport vehicle 10 enters a one-wheel traveling state with either the first wheels 41 or the second wheels 42 rolling on the travel surface of the corresponding travel rail 12 and the other of the first wheels 41 or the second wheels 42 separated from the corresponding travel rail 12. Here, a first one-wheel traveling state refers to a one-wheel traveling state in which the first wheels 41 roll on the first travel surface F1 and the second wheels 42 are separated from the second rail 12B, and a second one-wheel traveling state refers to a one-wheel traveling state in which the second wheels 42 roll on the second travel surface F2 and the first wheels 41 are separated from the first rail 12A. In the first one-wheel traveling state, the orientation of the article transport vehicle 10 is maintained by the first wheels 41 and the guide wheels 37 that are in contact with the guide rail 14 from the first side W1 in the width direction W. In the second one-wheel traveling state, the orientation of the article transport vehicle 10 is maintained by the second wheels 42 and the guide wheels 37 that are in contact with the guide rail 14 from the second side W2 in the width direction W. For example, in response to the article transport vehicle 10 turning left, the article transport vehicle 10 enters the first one-wheel traveling state, and the wheels on the outer circumferential side, namely the second wheels 42 are not supported by the second rail 12B, as shown in FIGS. 9 and 10.

The guide rail 14 of this embodiment is provided in such a manner that the orientation of the article transport vehicle 10 in the first one-wheel traveling state is an inclined orientation in which the second wheels 42 are located above the first wheels 41, and the orientation of the article transport vehicle 10 in the second one-wheel traveling state is an inclined orientation in which the first wheels 41 are located above the second wheels 42. This can tilt the article transport vehicle 10 toward the inner circumferential side of the curved path and raise the second wheels 42, thereby reducing the impact of separation and re-contact between the second rail 12B and the second wheels 42 in the example shown in FIGS. 9 and 10.

Figure 12:
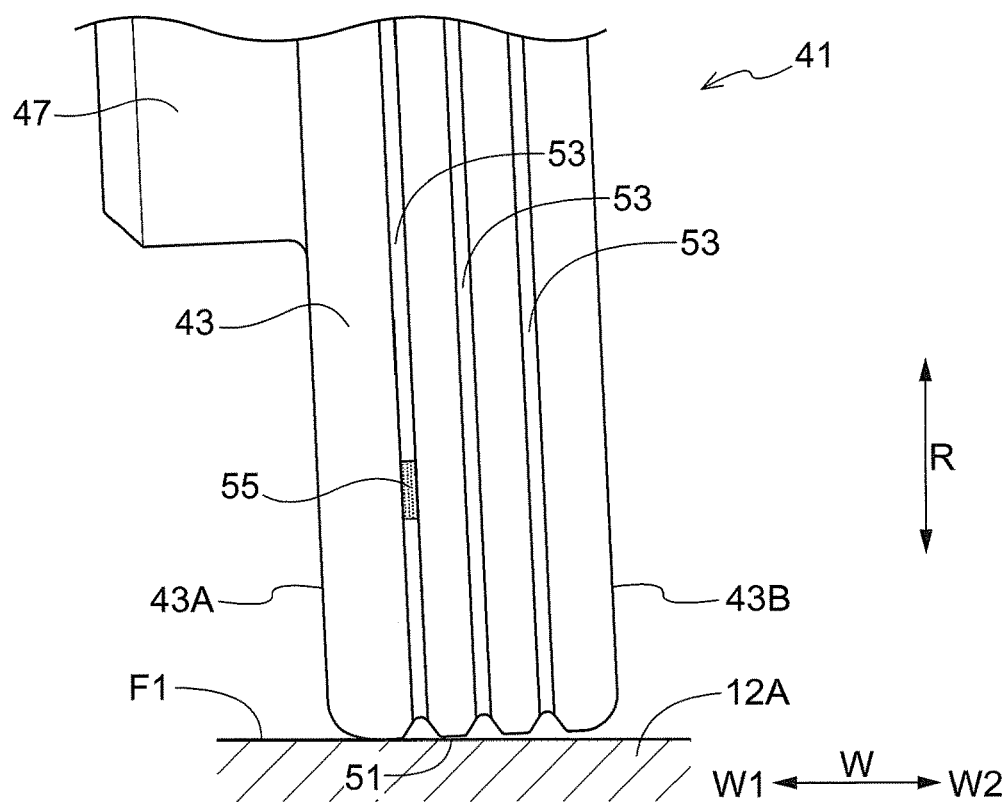
FIG. 12 shows a rear view of the first wheel in FIG. 1 traveling along a curved path.

FIG. 12 corresponds to FIG. 3 and shows the state of the first wheel 41 as the article transport vehicle 10 turns left. Upon the article transport vehicle 10 being tilted toward the inner circumferential side of the curved path during a left turn, each first wheel 41 tilts toward the outer circumferential side relative to the first rail 12A and comes into contact therewith, and the outer circumferential side of the first wheel 41 deforms, as shown in FIG. 12. Conversely, upon the article transport vehicle 10 being tilted toward the inner circumferential side of the curved path as the article transport vehicle 10 turns right, each second wheel 42 tilts toward the outer circumferential side of the second rail 12B and comes into contact therewith. In this embodiment, the first side W1 of the first wheel 41 in the width direction W and the second side W2 of the second wheel 42 in the width direction W serve as the inner side of the curved path in some cases, and are regions where the contact load between each wheel and the travel surface of the travel rail 12 is more likely to increase and deformation is more likely to occur during travel the curved path than the second side W2 of the first wheel 41 in the width direction W and the first side W1 of the second wheel 42 in the width direction W. Accordingly, wear can be effectively reduced by making the distance D11 shown in FIGS. 4 and 5 larger than the distance D12 and making the distance D22 shown in FIGS. 7 and 8 larger than the distance D21, as mentioned above.

In this embodiment, the guide rail 14 is disposed on the inner circumferential side of the curved path relative to the center in the width direction W to push the guide wheels 37 toward the inner circumferential side, thereby tilting the entire article transport vehicle 10 in the first one-wheel traveling state and the second one-wheel traveling state. There is no limitation to this configuration, and the article transport vehicle 10 may alternatively be configured in such a manner as to realize the first one-wheel traveling state and the second one-wheel traveling state by tilting a portion of the article transport vehicle 10 or by moving the first wheels 41 or the second wheels 42 in the up-down direction Z. The tilting of the article transport vehicle 10 is controlled by a later-described control unit 70 (see FIG. 1), for example.

Returning to FIG. 1, the article transport vehicle 10 of this embodiment has the control unit 70 that controls the traveling sections 32. The control unit 70 in the example shown in FIGS. 9 and 10 controls the first traveling section 32F and the second traveling section 32R. The control unit 70 can make the torque transmitted to the first front wheel 41F and the second front wheel 42F different from the torque transmitted to the first rear wheel 41R and the second rear wheel 42R. For example, the control unit 70 can cause the first traveling section 32F to follow the traveling of the second traveling section 32R by performing control (torque-free control) to set the driving torque of the first front wheel 41F and the second front wheel 42F applied by the first traveling section 32F to zero.

In this embodiment, the number of first recessed grooves 53 in either one of the first front wheel 41F or the first rear wheel 41R to which larger torque is transmitted is smaller than the number of first recessed grooves 53 in the other one of the first front wheel 41F and the first rear wheel 41R. Also, in this embodiment, the number of second recessed grooves 54 in either one of the second front wheel 42F or the second rear wheel 42R to which larger torque is transmitted is smaller than the number of second recessed grooves 54 in the other one of the second front wheel 42F and the second rear wheel 42R. This can reduce the number of grooves in the wheel to which larger torque is transmitted and increase the rigidity of the outer circumferential face of this wheel. Thus, deformation of the outer circumferential face of the wheel due to transmitted torque can be kept small, and wheel wear can be further reduced.

For example, if the first traveling section 32F follows the travel by the second traveling section 32R, the torque transmitted to the first rear wheel 41R and the second rear wheel 42R is larger than the torque transmitted to the first front wheel 41F and the second front wheel 42F. In this case, it is preferable that the number of first recessed grooves 53 in the first rear wheel 41R and the second recessed grooves 54 in the second rear wheel 42R is smaller than the number of first recessed grooves 53 in the first front wheel 41F and the second recessed grooves 54 in the second front wheel 42F. For example, a configuration may be employed in which the wheel with the larger transmitted torque may have three recessed grooves (as shown in FIGS. 4 and 7), and the wheel with the smaller transmitted torque may have six recessed grooves (as shown in FIGS. 5 and 8). For example, the wheel with the larger transmitted torque may have zero or one recessed groove, and the wheel with the smaller transmitted torque may have two or more recessed grooves. It is desirable that the shape of the wheel formed by the recessed grooves in the wheel with the larger transmitted torque is the shape shown in FIGS. 4, 5, 7, and 8, i.e.

asymmetric in the width direction W. Also, it is desirable that the shape of each recessed groove in the wheel with the smaller transmitted torque is the shape shown in FIGS. 4, 5, 7, and 8, i.e. asymmetric in the width direction W, but may alternatively be the shape shown in FIG. 13, i.e. symmetric in the width direction W.

Other Embodiments

Next, other embodiments of the article transport vehicle 10 will be described.

(1) The above embodiment has described an example of a configuration where the article transport vehicle 10 is an overhead transport vehicle. However, there is no limitation to this example, and the article transport vehicle 10 may alternatively be an unmanned transport vehicle that travels along the first rail 12A and the second rail 12B that are disposed on the floor, for example. Alternatively, the article transport vehicle 10 may travel along the first rail 12A and the second rail 12B and autonomously travel onto a branch path and a merging path.

(2) The above embodiment has described an example of a configuration where the first travel surface F1 and the second travel surface F2 are flat surfaces, and the first outer circumferential face 51 and the second outer circumferential face 52 each have a cylindrical shape. However, there is no limitation to this configuration, and the first travel surface F1 and the second travel surface F2 may be curved surfaces, for example. The first outer circumferential face 51 and the second outer circumferential face 52 may alternatively have a conical shape.

(3) The above embodiment has described an example of a configuration where the connection section between the first outer circumferential face 51 and the first side face 43A is curved. However, there is no limitation to this configuration. For example, the connection section between the first outer circumferential face 51 and the first side face 43A and the connection section between the second outer circumferential face 52 and the fourth side face 44D may have a C-chamfer shape.

(4) The above embodiment has described an example of a configuration where the curvature radius Ra is larger than the curvature radius Rb, and the curvature radius Rd is larger than the curvature radius Rc. However, there is no limitation to this configuration. For example, the curvature radius Ra, the curvature radius Rb, the curvature radius Rc, and the curvature radius Rd may all be the same.

(5) The above embodiment has described an example of a configuration where the cross sections of the groove bottoms of the first recessed grooves 53 and the second recessed grooves 54 taken along the radial direction R each have an arc shape. However, there is no limitation to this configuration. For example, the cross sections of the groove bottoms of the first recessed grooves 53 and the second recessed grooves 54 taken along the radial direction R may each have a triangular or trapezoidal shape.

(6) The above embodiment has described an example of a configuration where the dimension P12 is larger than or equal to the first width P1 and less than double the first width P1, and the dimension P11 is larger than or equal to double the first width P1. However, there is no limitation to this configuration, and the dimensions P12 and P11 may each be less than the first width P1, for example. The above embodiment has also described an example of a configuration where the dimension P21 is larger than or equal to the second width P2 and less than double the second width P2, and the dimension P22 is larger than or equal to double the second width P2. However, there is no limitation to this configuration, and the dimensions P21 and P22 may be less than second width P2, for example.

(7) The above embodiment has described an example of a configuration where one of the plurality of first recessed grooves 53 has the first marker groove 55, and one of the plurality of second recessed grooves 54 has the second marker groove 56. However, there is no limitation to this configuration, and a configuration without the first marker groove 55 and the second marker groove 56 may alternatively be employed, for example.

(8) The above embodiment has described an example of a configuration where the article transport vehicle 10 includes the control unit 70. However, there is no limitation to this configuration. For example, the control unit 70 may be provided in an external controller (not shown) that is independent of the article transport vehicle 10. Further, for example, if the control unit 70 has two or more pieces of hardware that are separated from each other in a communicable manner, some pieces of the hardware may be installed in the article transport vehicle 10 and the remaining pieces may be installed in the external controller.

(9) The above embodiment has described an example of a configuration in which the article transport vehicle 10 has two traveling sections 32, namely the first traveling section 32F and the second traveling section 32R. However, there is no limitation to this configuration, and the article transport vehicle 10 may have only one traveling section 32, or three or more traveling sections 32, for example. Further, each traveling section 32 need not have a guide wheel 37, for example.

(10) Note that the configurations disclosed in the above embodiment can also be applied in combination with configurations disclosed in other embodiments, as long as no contradictions arise. Regarding other configurations as well, the embodiments disclosed in this specification are merely examples in all respects. Therefore, various modifications can be made as appropriate without departing from the scope of the present disclosure.

SUMMARY OF THE ABOVE EMBODIMENT

The above article transport vehicle will be described below.

The article transport vehicle according to the present disclosure is an article transport vehicle configured to travel along a first rail and a second rail parallel to each other and transport an article, the article transport vehicle comprising: a vehicle body to which an article holder configured to hold the article is joined; at least one first wheel supported by the vehicle body rotatably about a first rotation axis along a width direction orthogonal to a direction in which the first rail and the second rail extend as viewed in an up-down direction, and configured to roll on a first travel surface, which is a travel surface of the first rail; and at least one second wheel supported by the vehicle body rotatably about a second rotation axis along the width direction, and configured to roll on a second travel surface, which is a travel surface of the second rail, wherein the at least one first wheel has a first outer circumferential face configured to come into contact with the first travel surface, the at least one second wheel has a second outer circumferential face configured to come into contact with the second travel surface, the at least one first wheel has a first-wheel body that includes the first outer circumferential face and is made of a synthetic resin, the at least one second wheel has a second-wheel body that includes the second outer circumferential face and is made of a synthetic resin, the first outer circumferential face has a plurality of first recessed grooves extending in a circumferential direction of the at least one first wheel, the second outer circumferential face has a plurality of second recessed grooves extending in a circumferential direction of the at least one second wheel, the first-wheel body has a first side face facing a first side in the width direction, and a second side face facing a second side in the width direction, the first side in the width direction being a side in the width direction on which the at least one first wheel is disposed relative to the at least one second wheel, the second side in the width direction being a side opposite to the first side in the width direction, the second-wheel body has a third side face facing the first side in the width direction, and a fourth side face facing the second side in the width direction, the first side face is separated, in the width direction, from a first recessed groove disposed farthest on the first side in the width direction among the plurality of first recessed grooves, by a distance that is larger than a distance by which the second side face is separated, in the width direction, from a first recessed groove disposed farthest on the second side in the width direction among the plurality of first recessed grooves, and the fourth side face is separated, in the width direction, from a second recessed groove disposed farthest on the second side in the width direction among the plurality of second recessed grooves, by a distance that is larger than a distance by which the third side face is separated, in the width direction, from a second recessed groove disposed farthest on the first side in the width direction among the plurality of second recessed grooves.

According to this configuration, the outer circumferential face of each wheel has a plurality of recessed grooves extending in the circumferential direction. This makes it possible to reduce wheel wear while ensuring a wheel width necessary for supporting the weight of the article transport vehicle. A possible reason for the reduced wheel wear, although hypothetical, is that forming the recessed grooves on the circumferential face of each wheel reduces the true contact area of the outer circumferential face relative to the travel surface of the rail, thereby reducing the shearing force applied to the wheel in the sliding direction. Further, according to this configuration, a region without a recessed groove can be provided in an outer portion of the outer circumferential face in the width direction, where a contact load between the wheel and the travel surface of the rail tends to increase during travel along a curved path. This makes it easy to ensure the rigidity in the area where the contact load between the wheel and the travel surface of the rail is likely to increase during travel along a curved path. Accordingly, deformation of the outer circumferential face of each wheel during travel along a curved path can be kept small, thus further reducing wheel wear.

As one mode, it is preferable that the first travel surface and the second travel surface are flat surfaces, the first outer circumferential face has a cylindrical shape with a central axis parallel to the first travel surface, and the second outer circumferential face has a cylindrical shape with a central axis parallel to the second travel surface.

According to this configuration, the load is likely to act evenly on the entire first outer circumferential face and second outer circumferential face, excluding the portions where the recessed grooves are formed, during straight travel. Accordingly, the durability of the wheels can be easily increased.

As one mode, it is preferable that the first outer circumferential face and the first side face are connected at a connection section that is curved inward in a radial direction while extending toward the first side in the width direction, the radial direction being orthogonal to the first rotation axis and the second rotation axis, the first outer circumferential face and the second side face are connected at a connection section that is curved inward in the radial direction while extending toward the second side in the width direction, the second outer circumferential face and the third side face are connected at a connection section that is curved inward in the radial direction while extending toward the first side in the width direction, and the second outer circumferential face and the fourth side face are connected at a connection section that is curved inward in the radial direction while extending toward the second side in the width direction.

According to this configuration, deformation of the wheel body can be easily suppressed in response to a large contact load acting on an outer portion of the wheel body in the width direction during travel along a curved path. Thus, wheel wear can be further reduced.

As one mode, it is preferable that the connection section between the first outer circumferential face and the first side face has a curvature radius that is larger than a curvature radius of the connection section between the first outer circumferential face and the second side face, and the connection section between the second outer circumferential face and the fourth side face has a curvature radius that is larger than a curvature radius of the connection section between the second outer circumferential face and the third side face.

According to this configuration, deformation of the connection section on the outer side of the wheel body in the width direction can be easily suppressed in response to a large contact load acting on an outer portion of the wheel body in the width direction during travel along a curved path. Accordingly, wheel wear can be further reduced.

As one mode, it is preferable that the plurality of first recessed grooves each have a groove bottom having an arc-shaped cross section taken along a radial direction orthogonal to the first rotation axis and the second rotation axis, and the plurality of second recessed grooves each have a groove bottom having an arc-shaped cross section taken along the radial direction.

This configuration can reduce the likelihood of cracking or other damage to the wheel body occurring from the groove bottom.

As one mode, it is preferable that the plurality of first recessed grooves include three or more first recessed grooves next to each other in the width direction, the first outer circumferential face includes flat portions respectively disposed between pairs of the first recessed grooves adjacent in the width direction, among the flat portions, a flat portion disposed on the second side in the width direction relative to a first recessed groove disposed farthest on the second side in the width direction among the first recessed grooves has a width that is larger than or equal to a first width and less than double the first width, the first width being a smallest width of the flat portions, among the flat portions, a flat portion disposed on the first side in the width direction relative to a first recessed groove disposed farthest on the first side in the width direction among the first recessed grooves has a width that is larger than or equal to double the first width, the plurality of second recessed grooves include three or more second recessed grooves next to each other in the width direction, the second outer circumferential face includes flat portions respectively disposed between pairs of the second recessed grooves adjacent in the width direction, among the flat portions, a flat portion disposed on the first side in the width direction relative to a second recessed groove disposed farthest on the first side in the width direction among the second recessed grooves has a width that is larger than or equal to a second width and less than double the second width, the second width being a smallest width of the flat portions, and among the flat portions, a flat portion disposed on the second side in the width direction relative to a second recessed groove disposed farthest on the second side in the width direction among the second recessed grooves has a width that is larger than or equal to double the second width.

According to this configuration, an area where the recessed groove is not formed can be easily provided in an outer portion of the outer circumferential face in the width direction where the contact load between each wheel and the travel surface of the corresponding rail is likely to increase during travel along a curved path, while keeping small the contact area of the outer circumferential face of each wheel with the travel surface of the corresponding rail. Accordingly, deformation of the outer circumferential face of each wheel during travel along a curved path can be easily suppressed, thus further reducing wheel wear.

As one mode, it is preferable that the at least one first wheel includes a first front wheel and a first rear wheel, the at least one second wheel includes a second front wheel and a second rear wheel, the first front wheel and the second front wheel are subjected to torque that is different from torque transmitted to the first rear wheel and the second rear wheel, whichever one of the first front wheel and the first rear wheel is subjected to larger torque has fewer first recessed grooves than another one of the first front wheel and the first rear wheel, and whichever one of the second front wheel and the second rear wheel is subjected to larger torque has fewer second recessed grooves than another one of the second front wheel and the second rear wheel.

According to this configuration, the number of grooves in the wheel with the larger transmitted torque can be reduced to increase the rigidity of the outer circumferential face. Thus, deformation of the outer circumferential face of the wheel due to the transmitted torque can be kept small, thus further reducing wheel wear.

As one mode, it is preferable that at least one of the plurality of first recessed grooves has a first marker groove having a same depth as a first radius decrement, which is a decrement in a radius of the at least one first wheel and serves as a reference for a replacement timing of the at least one first wheel, and at least one of the plurality of second recessed grooves has a second marker groove having a same depth as a second radius decrement, which is a decrement in a radius of the at least one second wheel and serves as a reference for a replacement timing of the at least one second wheel.

According to this configuration, the replacement timing of the wheels can be determined by the loss of the marker grooves. Accordingly, the replacement timing of the wheels can be easily determined with a visual check.

INDUSTRIAL APPLICABILITY

The technology according to the present disclosure is applicable to article transport vehicles.

What is claimed is:

1. An article transport vehicle configured to travel along a first rail and a second rail parallel to each other and transport an article, the article transport vehicle comprising:
  a vehicle body to which an article holder configured to hold the article is joined;
  at least one first wheel supported by the vehicle body rotatably about a first rotation axis along a width direction orthogonal to a direction in which the first rail and the second rail extend as viewed in an up-down direction, and configured to roll on a first travel surface, which is a travel surface of the first rail; and
  at least one second wheel supported by the vehicle body rotatably about a second rotation axis along the width direction, and configured to roll on a second travel surface, which is a travel surface of the second rail,
  wherein:
  the at least one first wheel has a first outer circumferential face configured to come into contact with the first travel surface,
  the at least one second wheel has a second outer circumferential face configured to come into contact with the second travel surface,
  the at least one first wheel has a first-wheel body that includes the first outer circumferential face and is made of a synthetic resin,
  the at least one second wheel has a second-wheel body that includes the second outer circumferential face and is made of a synthetic resin,
  the first outer circumferential face has a plurality of first recessed grooves extending in a circumferential direction of the at least one first wheel,
  the second outer circumferential face has a plurality of second recessed grooves extending in a circumferential direction of the at least one second wheel,
  the first-wheel body has a first side face facing a first side in the width direction, and a second side face facing a second side in the width direction, the first side in the width direction is a side in the width direction on which the at least one first wheel is disposed relative to the at least one second wheel, the second side in the width direction is a side opposite to the first side in the width direction,
  the second-wheel body has a third side face facing the first side in the width direction, and a fourth side face facing the second side in the width direction,
  the first side face is separated, in the width direction, from a first recessed groove disposed farthest on the first side in the width direction among the plurality of first recessed grooves, by a distance that is larger than a distance by which the second side face is separated, in the width direction, from a first recessed groove disposed farthest on the second side in the width direction among the plurality of first recessed grooves, and
  the fourth side face is separated, in the width direction, from a second recessed groove disposed farthest on the second side in the width direction among the plurality of second recessed grooves, by a distance that is larger than a distance by which the third side face is separated, in the width direction, from a second recessed groove disposed farthest on the first side in the width direction among the plurality of second recessed grooves.

2. The article transport vehicle according to claim 1, wherein:
  the first travel surface and the second travel surface are flat surfaces,
  the first outer circumferential face has a cylindrical shape with a central axis parallel to the first travel surface, and
  the second outer circumferential face has a cylindrical shape with a central axis parallel to the second travel surface.

3. The article transport vehicle according to claim 2, wherein:

the first outer circumferential face and the first side face are connected at a connection section that is curved inward in a radial direction while extending toward the first side in the width direction, the radial direction is orthogonal to the first rotation axis and the second rotation axis, the first outer circumferential face and the second side face are connected at a connection section that is curved inward in the radial direction while extending toward the second side in the width direction, the second outer circumferential face and the third side face are connected at a connection section that is curved inward in the radial direction while extending toward the first side in the width direction, and the second outer circumferential face and the fourth side face are connected at a connection section that is curved inward in the radial direction while extending toward the second side in the width direction.

4. The article transport vehicle according to claim 3, wherein the connection section between the first outer circumferential face and the first side face has a curvature radius that is larger than a curvature radius of the connection section between the first outer circumferential face and the second side face, and wherein the connection section between the second outer circumferential face and the fourth side face has a curvature radius that is larger than a curvature radius of the connection section between the second outer circumferential face and the third side face.

5. The article transport vehicle according to claim 1, wherein the plurality of first recessed grooves each have a groove bottom having an arc-shaped cross section taken along a radial direction orthogonal to the first rotation axis and the second rotation axis, and wherein the plurality of second recessed grooves each have a groove bottom having an arc-shaped cross section taken along the radial direction.

6. The article transport vehicle according to claim 1, wherein:

the plurality of first recessed grooves include three or more first recessed grooves next to each other in the width direction, the first outer circumferential face includes flat portions respectively disposed between pairs of the first recessed grooves adjacent in the width direction, among the flat portions, a flat portion disposed on the second side in the width direction relative to a first recessed groove disposed farthest on the second side in the width direction among the first recessed grooves has a width that is larger than or equal to a first width and less than double the first width, the first width is a smallest width of the flat portions, among the flat portions, a flat portion disposed on the first side in the width direction relative to a first recessed groove disposed farthest on the first side in the width direction among the first recessed grooves has a width that is larger than or equal to double the first width, the plurality of second recessed grooves include three or more second recessed grooves next to each other in the width direction, the second outer circumferential face includes flat portions respectively disposed between pairs of the second recessed grooves adjacent in the width direction, among the flat portions, a flat portion disposed on the first side in the width direction relative to a second recessed groove disposed farthest on the first side in the width direction among the second recessed grooves has a width that is larger than or equal to a second width and less than double the second width, the second width is a smallest width of the flat portions, and among the flat portions, a flat portion disposed on the second side in the width direction relative to a second recessed groove disposed farthest on the second side in the width direction among the second recessed grooves has a width that is larger than or equal to double the second width.

7. The article transport vehicle according to claim 1, wherein:

the at least one first wheel includes a first front wheel and a first rear wheel, the at least one second wheel includes a second front wheel and a second rear wheel, the first front wheel and the second front wheel are subjected to torque that is different from torque transmitted to the first rear wheel and the second rear wheel, whichever one of the first front wheel and the first rear wheel is subjected to larger torque has fewer first recessed grooves than another one of the first front wheel and the first rear wheel, and whichever one of the second front wheel and the second rear wheel is subjected to larger torque has fewer second recessed grooves than another one of the second front wheel and the second rear wheel.

8. The article transport vehicle according to claim 1, wherein at least one of the plurality of first recessed grooves has a first marker groove having a same depth as a first radius decrement, which is a decrement in a radius of the at least one first wheel and serves as a reference for a replacement timing of the at least one first wheel, and wherein at least one of the plurality of second recessed grooves has a second marker groove having a same depth as a second radius decrement, which is a decrement in a radius of the at least one second wheel and serves as a reference for a replacement timing of the at least one second wheel.

* * * * *

UNITED STATES PATENT AND TRADEMARK OFFICE
CERTIFICATE OF CORRECTION

| | | |
|---|---|---|
| PATENT NO. | : 12,172,841 B2 | Page 1 of 1 |
| APPLICATION NO. | : 18/201337 | |
| DATED | : December 24, 2024 | |
| INVENTOR(S) | : Zheguang Dong | |

It is certified that error appears in the above-identified patent and that said Letters Patent is hereby corrected as shown below:

On the Title Page

Column 1, on the line after:
"(65) Prior Publication Data
US 2023/0382647 A1 Nov. 30, 2023", insert:
-- (30)   Foreign Application Priority Data
May 25, 2022 (JP) ............ 2022-085584 --

Signed and Sealed this
Twenty-fifth Day of February, 2025

Coke Morgan Stewart
*Acting Director of the United States Patent and Trademark Office*